Figure 1:
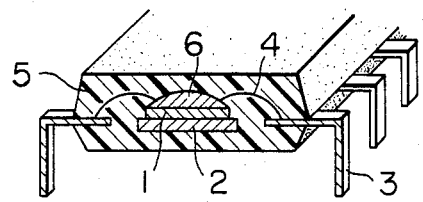

United States Patent [19]

Suzuki et al.

[11] Patent Number: 4,494,217
[45] Date of Patent: Jan. 15, 1985

[54] SEMICONDUCTOR MEMORIES WITH α SHIELD

[75] Inventors: Hiroshi Suzuki, Hitachi; Goro Tanaka, Fujisawa; Akio Nishikawa, Hitachi; Junji Mukai, Hitachi; Mikio Sato, Hitachi; Daisuke Makino, Hitachi; Yoshiaki Wakashima, Kawasaki, all of Japan

[73] Assignees: Hitachi, Ltd.; Hitachi Chemical Company, Ltd., both of Tokyo, Japan

[21] Appl. No.: 222,612

[22] Filed: Jan. 5, 1981

[30] Foreign Application Priority Data

Jan. 9, 1980 [JP] Japan ..................... 55-587

[51] Int. Cl.$^3$ .................. G11C 5/00; G11C 11/34
[52] U.S. Cl. ........................ 365/53; 357/23; 357/84; 365/174
[58] Field of Search ............ 365/53, 52, 174; 357/23 R, 84

[56] References Cited

U.S. PATENT DOCUMENTS 4,323,405 4/1982 Uno et al. ..................... 357/80

OTHER PUBLICATIONS

May et al., Proceedings 16th International Reliability Physics Symposium, 4/18-20/78, San Diego, pp. 33-40.
Anolick, "Reduction of Memory Errors Due to Alpha Particles", IBM Tech. Disc. Bul., vol. 22, No. 6, 11/79, pp. 2345-2346.
Ward, "Alpha Particle Shield", IBM Tech. Disc. Bul., vol. 22, No. 4, 9/79, p. 1398.
Anolick, "Prevention of Errors in Charge-Coupled Devices Due to Alpha Emission", IBM Tech. Disc. Bul., vol. 22, No. 2, 7/79, p. 678.
Dougherty et al., "Low α Particle Package Design", IBM Tech. Disc. Bul., vol. 22, No. 7, 12/79, p. 2748.

*Primary Examiner*—Stuart N. Hecker
*Attorney, Agent, or Firm*—Antonelli, Terry & Wands

[57] ABSTRACT

In a semiconductor memory device comprising semiconductor memory elements having such a degree of integration in memory circuits as to produce soft errors by incident α-rays derived from a packaging material and a package which packages the memory elements and is made from the packaging material, when an α-rays shielding layer made from a resinous material, which may contain one or more high-purity fillers, containing a total amount of 1 part per billion or less of uranium and thorium is interposed between the memory elements and the package, the generation of soft errors is reduced remarkably.

17 Claims, 5 Drawing Figures

SEMICONDUCTOR MEMORIES WITH α SHIELD

This invention relates to semiconductor memories having high levels of integration in memory circuits and a process for producing the same.

It is reported in an article "A New Physical Mechanism for Soft Errors in Dynamic Memories" recited in 16th Annual Proceedings of 1978 International Reliability Physics Symposium, Apr. 18–20, 1978, San Diego, U.S.A., pp. 33–40 that when incidence of α-rays into semiconductor memory cells takes place, reversal of information of "1"→"0" or "0"→"1", that is, soft errors, is often caused. A major source of the α-rays is trace amounts of uranium and thorium contained in a packaging material for semiconductor memory elements such as ceramic, metals, molding resins, or the like. Therefore, if uranium and thorium are removed from such a packaging material completely, the above-mentioned problem may be solved. According to the above-mentioned report, purification of packaging materials has been tried in order to lessen the contents of uranium and thorium, but such a purification to high level is remarkably difficult industrially. Thus, it has been thought to be practically difficult to solve the problem of soft errors by purification of packaging materials.

On the other hand, the present inventors have studied the purification of packaging materials and found that when the contents of uranium and thorium became lower than certain values, the phenomenon of soft errors decreased remarkably or hardly took place.

It is an object of this invention to provide a semiconductor memory device having high levels of integration in memory circuits producing little soft error by α-rays. It is another object of this invention to provide a process for producing such a semiconductor memory device.

In accordance with this invention, the semiconductor memory device comprising semiconductor memory elements having such a degree of integration in memory circuits as to bring about soft errors by incidence of α-rays from a packaging material and a package which packages the memory elements is characterized by interposing an α-rays shielding layer which is made from a resinous material and contains uranium and thorium in a total amount of 1 part per billion (ppb) or less between said memory elements and said package.

In the attached drawings, FIGS. 1 to 5 are cross-sectional views of some examples of the semiconductor memory devices of this invention.

According to this invention, there can be produced semiconductor memories having high levels of integration in memory circuits producing remarkably small or practically no soft errors by interposing the α-rays shielding layer made from a resinous material which contains uranium and thorium in a total amount of 1 ppb or less (hereinafter referred to as "high-purity resinous material"). It is possible to correct soft errors by means of electric circuits and thus it is possible to secure reliability of devices such as computers. But, as generally admitted, when the soft error rate of memory elements themselves is over 1000 fits, security of reliability of devices by means of electric circuits becomes difficult. Therefore, it has an important meaning to suppress the generating rate of soft errors in memory elements themselves less than 1000 fits. The present inventors have found that when the total amount of uranium and thorium in the package was 1 ppb or less, the generating rate of soft errors was reduced remarkably and accomplished this invention. Further, according to this invention, it is possible to suppress the generating rate of soft errors below 100 fits by making the total amount of uranium and thorium 0.2 ppb or less.

According to this invention, the α-rays shielding layer is formed between the memory elements and the package as mentioned above. More in detail, it is preferable to cover the top surface of memory elements in the range corresponding to that of the incidence angle of α-rays from 20° to 90° (perpendicular incidence) with the α-rays shielding layer. It is more preferable to cover the whole surfaces of semiconductor memory elements completely with the α-rays shielding layer. In either case, the α-rays shielding layer can be formed directly on the surfaces of semiconductor memory elements, or it can be formed without directly contacting with the memory elements, for example, on the side of ceramic package, i.e., the back side of said package.

The resinous material which makes the α-rays shielding layer means polymers such as synthetic resins, natural resins, synthetic rubbers, natural rubbers, and the like. In the case of polymers obtained by syntheses, highly pure ones can easily be produced by polymerizing monomers purified by, for example, distillation, recrystallization, and the like. Examples of the resinous materials are polyimides, polyamides, polybenzimidazole, polyamide-imides, polyimideisoindroquinazolinedion, epoxy resins, phenolic resins, diallyl phthalate resins, fluorine resins, polyester resins, silicone resins, polysilicate resins, and the like. The resinous material may contain various kinds of fillers in order to improve physical properties of the α-rays shielding layer. Needless to say, the fillers should be highly purified ones so as to satisfy the above-mentioned conditions as to the contents of uranium and thorium. That is, the resin and/or filler should be purified so that the total amount of uranium and thorium in the α-rays shielding layer should be 1 ppb or less.

Highly pure fillers are prepared by using as starting materials organometallic compounds such as silicon compounds, e.g., tetramethylsilane, dimethyldimethoxysilane, trichlorosilane, tetraethoxysilane, dimethyldichlorosilane, diphenyldichlorosilane, etc.; aluminum compounds, e.g., aluminum triisopropylate, mono-sec-butoxyaluminum diisopropylate, aluminum tributylate, ethylacetoacetate aluminum diisopropylate, aluminum tris(ethylacetoacetate), etc.; zirconium compounds, e.g., zirconium tetrakisacetylacetonate, etc.; zinc compounds, e.g., zinc salicylate, zinc octoate, etc.; lead compounds, e.g., lead octoate, tetraphenyl lead, etc.; tin compounds, e.g., tin octoate, tetraphenyl tin, etc.

These compounds are preferably used after purified by, for example, distillation, recrystallization, or the like and oxidized in the air or in oxygen by heating oxidation or plasma oxidation to give highly pure fillers in the form of oxides or nitrides. It is advantageous in practical treatment to hydrolyze these starting materials or to hydrolyze another kinds of starting materials followed by polymerization prior to oxidation of these starting materials. For example, there is a merit in that volatile scattering of the starting materials during the heating can be prevented. The thus synthesized metal oxides are generally in powder state and can be used as fillers as they are. If necessary, these metal oxides may be ground more finely. It is easy to obtain these metal oxide fillers containing remarkably small amounts of uranium and thorium compared to generally used fillers which are prepared by grinding natural products finely.

Other examples of fillers are polymers having no film forming ability by themselves such as polyimide powder ring closed with heating, polyimidazopyrrolone powder, poly Schiff bases, silicone rubber, and the like.

The use of a coating material containing a filler makes it possible to prevent the generation of cracks caused by shrinkage at the time of baking or during heat cycles, to improve strength of the shielding layer, to improve temperature for beginning weight loss on heating, to improve heat conduction (heat scattering properties), and to reduce coefficients of thermal expansion.

When the shielding layer is formed by using the resinous material or resinous material containing a filler, a suitable solvent may be used for dissolving or dispersing said resinous material with or without filler. As the solvent, there may be used those conventionally used as solvents for resin varnishes. Examples of such solvents are N-methyl-2-pyrrolidone, N,N-dimethyl acetamide, N,N-dimethyl formamide, N,N-diethyl formamide, N-methyl formamide, dimethyl sulfoxide, N,N-diethyl acetamide, N,N-dimethylmethoxy acetamide, hexamethylphosphoramide, pyridine, dimethyl sulfone, tetramethyl sulfone, dimethyltetramethylene sulfone, phenol, cresol, xylenols, ketones, toluene, benzene, alcohols, and the like. These solvents may be used alone or as a mixture thereof. The resinous material may contain, if necessary, one or more conventional silane series coupling agents such as aminosilane, epoxysilane, mercaptosilane, vinylsilane, and the like, and one or more surface active agents such as fluorocarbons, and the like. Needless to say, these solvents and additives should contain uranium and thorium in remarkably small amounts or none.

The α-rays shielding layer which is made from the high-purity resinous material containing one or more fillers or no filler and has a thickness of 30 μm or more, preferably 40 μm or more can give sufficient effects on preventing soft errors. In the case of semiconductor memory elements having a low level of integration in memory circuits, the intended object can be attained even if the thickness of the shielding layer is less than 30 μm.

Figure 2:
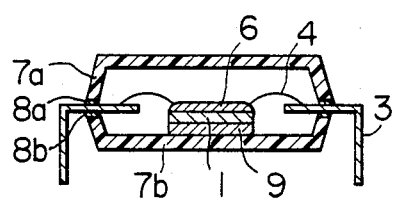
Figure 4:
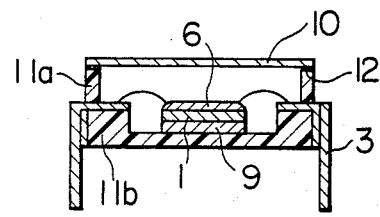
Figure 3:
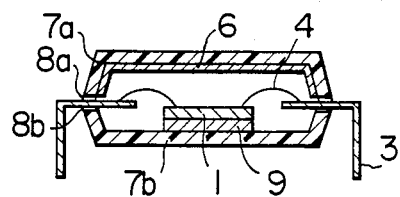
Figure 5:
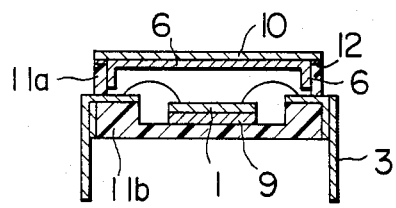

Formation of the α-rays shielding layer between the package and the memory elements is explained in detail referring to the attached drawings. FIG. 1 is a cutaway perspective view of a dual-in-line type resin package semiconductor memory device in which this invention is applied. In FIG. 1, numeral 1 denotes a semiconductor memory element, that is a silicon chip, numeral 2 denotes a support for silicon chip, numeral 3 denotes a lead, numeral 4 denotes a bonding wire, numeral 5 denotes a resin package, and numeral 6 denotes an α-rays shielding layer. In this example, the α-rays shielding layer 6 is coated on the surface of silicon chip. The resin package 5 can be formed by molding a thermosetting resin such as an epoxy resin. FIGS. 2 and 3 are cross-sectional views of dual-in-line type ceramic package semiconductor memory devices in which this invention is applied. Numerals 7a and 7b denote ceramic packages which are sealed with sealing materials 8a and 8b such as glass. A silicon chip 1 is fixed on the package 8b with a jointing agent such as a silver paste, a gold-silicon eutectic crystal layer or a solder layer conventionally used. In FIG. 2, the α-rays shielding layer 6 is coated on the surface of the silicon chip 1 and in FIG. 3 it is coated on the inner surface of the package 7a. In the case of FIG. 2, a smaller amount of the α-rays shielding material is used than the case of FIG. 3. On the other hand, in the case of FIG. 3, it is not always necessary to add a filler to the resinous material which forms the α-rays shielding layer 6; this is advantageous. In other words, when the resinous material is directly coated on the silicon chip 1, it is often necessary to add a filler to the resinous material in order to give crack resistance, but in the case of FIG. 3, such addition of filler is not always necessary. Further, there is no fear of touching and damaging the silicon chip 1 and the bonding wire 4 during the production process of semiconductor memories. FIGS. 4 and 5 are cross-sectional views of metal cap type dual-in-line type ceramic (cofired ceramic-laminated ceramic) package semiconductor memory devices in which this invention is applied. In FIGS. 4 and 5, numeral 10 denotes a metal cap made of, for example, gold-plated koval (a Fe-Ni-Co alloy) and numeral 11a and 11b denote ceramic packages formed in one piece together with the lead 3, and numeral 12 is a sealing material such as an Au-Sn alloy which seals the boundary between the metal cap 10 and the ceramic package 11a. The lead 3 is a side brazing type. The examples shown in FIGS. 4 and 5 are fundamentally the same ones as shown in FIGS. 2 and 3 except for the material construction of the metal cap 10 and the sealing material 12 and the ceramic packages 11a and 11b being preformed and sintered.

Since soft errors are readily caused in the case of semiconductor memory elements having a high degree of integration, for example, one side of the memory element being about 3 to 10 mm long, in the case of bipolar type semiconductor memory elements those having a degree of integration of a memory capacity of 1K-bit or more, and in the case of MIS (metal-insulator-semiconductor) type such as MOS (metal-oxide-semiconductor) type semiconductor memory elements those having a degree of integration of a memory capacity of 16K-bits or more, particularly 64K-bits or more, this invention becomes more effective when applied to memory elements having such a degree of integration as mentioned above.

The contents of uranium and thorium can be determined by a conventional radioactivation analysis. In this invention, the values are obtained by the neutron radioactivation analysis method using a nuclear reactor. Uranium-239 and thorium-233 produced from the (n, r) reaction of uranium-238 and thorium-232 are disintegrated to plutonium-239 and uranium-233, respectively, by beta decay with a half-life of 23.5 minutes. γ-Rays radiated at that time are counted and the amounts of uranium and thorium can be determined quantitatively in comparison with the γ-rays counting rate of a standard sample irradiated under the same conditions. Measuring conditions are as follows:

Detector: a Ge (Li) semiconductor detector.
Analyzer: a 4000 ch wave high analyzer.
Counting time: 500 to 60,000 seconds.

This invention is illustrated by way of the following Examples and Experiments, in which all parts are by weight.

EXAMPLE 1

A resinous material (composition) for forming an γ-rays shielding layer was prepared by mixing 50 parts of 3,4-epoxycyclohexylmethyl-3,4-epoxycyclohexane carboxylate purified by vacuum distillation of a commercially available one under a pressure of 1 mm Hg at 155°–158° C., 50 parts of vinylcyclohexane dioxide vacuum distilled under 1 mm Hg at 65°–67° C., 77 parts of methyl Nadic Anhydride (a curing agent) vacuum distilled under 1 mm Hg at 113°–115° C., 66 parts of hexahydrophthalic anhydride (a curing agent) distilled under 3 mm Hg at 118°–122° C., 370 parts of powders as filler prepared by purifying ethyl silicate at 168°–170° C., followed by hydrolysis and heating in the air at about 500° C. for 4 hours, 2 parts of tetraphenylphosphoniumtetraphenyl borate (a curing accelerator), and 2 parts of γ-glycidoxypropyltrimethoxysilane (a coupling agent). The radioactivation analysis of this composition showed that the uranium content was 0.45 ppb and the thorium content was 0.55 ppb.

This composition was coated on MOS type, RAM type memory elements having a memory capacity of 16K-bits so as to give a thickness of 1 to 1.5 mm and cured with heating at 150° C. for 3 hours to produce the desired semiconductor memory device having an integral structure wherein the shielding layer and the package were made from the same materials.

The soft error rate of this memory device was 900 fits (1 fit means a unit showing that an error takes place per $10^9$ hours per one element).

COMPARATIVE EXAMPLE 1

A packaging material was prepared by using the same epoxy resin raw material as used in Example 1 without purification and non-purified silica powders commercially available as filler. The resulting packaging material contained uranium in an amount of 18 ppb and thorium in an amount of 11 ppb. A memory device was produced by coating this packaging material on whole of memory elements and curing them in the same manner as described in Example 1. The soft error rate of this memory device was $3.5 \times 10^4$ fits

EXAMPLE 2

A resin composition was prepared by mixing the same components as used in Example 1 except for the filler. The resulting resin composition contained uranium in an amount of less than 0.02 ppb and thorium in an amount of less than 0.05 ppb. This resin composition was coated on memory elements in two ways; that is, 40–50 μm thick and 1 to 1.5 mm thick, and baked. After baking, there took place cracks in the latter memory elements.

The memory elements coated with the resin composition in 40–50 μm thick were coated with the same packaging material as used in Comparative Example 1 in 1 to 1.5 mm thick and cured. The soft error rate of the resulting memory device was 30 fits.

EXAMPLE 3

Poly(amic acid) was prepared by reacting 4,4′-diaminodiphenyl ether recrystallized in n-butanol with pyromellitic dianhydride obtained by recrystallization from acetic anhydride followed by purification by sublimation in equimolar amounts in N-methylpyrrolidone obtained by drying with phosphoric anhydride followed by purification by distillation. The resulting poly(amic acid) was coated on the same memory elements as used in Example 1 and heated at 100° C. for 2 hours, at 200° C. for 1 hour and at 350° C. for 1 hour to give a shielding layer of polyimide having a thickness of 40 to 50 μm.

Subsequently, a metal cap was fused on a ceramic package at about 380° C. by using Au-Sn series sealing material to form packaging.

The soft error rate of the resulting memory device was 25 fits.

The above-mentioned polyimide contained uranium in an amount of less than 0.02 ppb and thorium in an amount of less than 0.05 ppb.

EXAMPLE 4

A semiconductor memory device was produced in the same manner as described in Example 3 except for not conducting purification treatment. The resinous material (polyimide) contained uranium in an amount of 0.07 ppb and thorium in an amount of 0.13 ppb.

The soft error rate of the resulting memory device was 100 fits.

On the other hand, when a memory device was produced by only ceramic packaging without coating with the polyimide, the soft error rate was $4.5 \times 10^6$ fits.

EXAMPLE 5

Ethylacetoacetate aluminum diisopropylate purified by distillation at 165°–175° C. under 3 mm Hg in an amount of 100 parts was dissolved in 500 parts of isopropanol, mixed with 10 parts of water and allowed to stand for 1 day. Then the mixture was heated in air at 150° C. for 1 hour, at 200° C. for 1 hour, at 300° C. for 1 hour, at 400° C. for 1 hour, at 500° C. for 1 hour, at 600° C. for 1 hour and at 700° C. for 1 hour for oxidation, followed by grinding in an agate mortar softly to give fine powders. The fine powders were mixed with the same high-purity poly(amic acid) varnish as prepared in Example 3 to give a resin composition. The mixing ratio of the polyimide obtained to the fine powders was 40 to 60 by weight. The resin composition was coated on the same memory elements as used in Example 1 to give a shielding layer having a thickness of 40 to 50 μm. A semiconductor memory device was produced by using ceramic package and low melting glass as fusing material and subjecting to sealing treatment at about 450° C.

The resin composition contained uranium in an amount of less than 0.07 ppb and thorium in an amount of less than 0.05 ppb.

The soft error rate of the resulting memory device was 40 fits.

EXPERIMENT 1

A resin composition was prepared by mixing a silicon containing α,ω-dihydroxypolydimethylsiloxane produced by hydrolysis of dimethyldichlorosilane purified by distillation and ethyl silicate purified by distillation as a crosslinking agent with fine powdered silica in a weight ratio of 60/40, followed by addition of 0.2% by weight of dibutyl tin laurate. The resin composition was coated on the same memory elements as used in Example 1 in 50 to 60 μm thick, allowed to stand for a while, and cured at a temperature higher than 150° C. to give a shielding layer. A memory device was produced by packing the resulting memory elements with an epoxy resin molding material containing about 70% by weight of silica glass powders.

The soft error rate of the resulting memory device was $9.5 \times 10^3$ fits.

The shielding layer contained uranium and thorium in amounts of 1.5 ppb as a whole.

EXAMPLE 6

A resin composition was prepared in the same manner as described in Experiment 1 except for using silica powders synthesized from ethyl silicate purified by distillation used in Example 1 in place of the fine powdered silica. A memory device was produced in the same manner as described in Experiment 1 using the abovementioned resin composition and the epoxy resin package.

The soft error rate of the resulting memory device was 40 fits.

The above-mentioned resin composition contained uranium in an amount of 0.05 ppb and thorium in an amount of less than 0.05 ppb.

EXAMPLE 7

Polydimethylsiloxane represented by the formula:

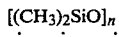

$[(CH_3)_2SiO]_n$ wherein n is mainly 3 to 6, was purified by distillation at 170° to 250° C. and oxidized in an atmosphere of oxygen to give fine powders containing $SiO_2$ as a major component. A resin composition for forming a shielding layer was prepared by adding 15 parts of said fine powders to 100 parts of poly(amic acid) varnish synthesized from the monomer purified by recrystallization (PIQ, a trade name of Hitachi Chemical Co., Ltd., non-volatile content 10%, a solvent N-methyl-2-pyrrolidone purified by distillation). Said varnish was coated on bipolar type semiconductor memory elements having a capacity of 1K-bit and heated at 100° C. for 2 hours, at 200° C. for 1 hour and at 350° C. for 1 hour to give a shielding layer made from polyimide-isoindroquinazolinedion having a thickness of 75 to 90 μm. The memory elements were packaged with ceramic package to give a memory device.

The soft error rate of the resulting memory device was 15 fits.

The above-mentioned varnish contained uranium in an amount of less than 0.02 ppb and thorium in an amount of less than 0.05 ppb.

EXPERIMENT 2

A memory device was produced in the same manner as described in Example 7 except for using as the resin composition for forming a shielding layer that prepared by mixing 15 parts of fine powders of silica glass commercially available and 100 parts of the same PIQ varnish as used in Example 7.

The soft error rate of the resulting memory device was 3500 fits.

The above-mentioned resin composition contained uranium in an amount of 15 ppb.

What is claimed is:

1. In a semiconductor memory device comprising semiconductor memory elements having such a degree of integration in memory circuits as to produce soft errors by incident α-rays, a resin package which packages the memory elements, and an α-rays shielding layer made from a resinous material interposed between the surface of the memory elements and the resin package, said α-shielding layer containing uranium and thorium in a total amount of 1 part per billion or less and having a thickness of at least 40 μm.

2. A semiconductor memory device according to claim 1, wherein the α-rays shielding layer is formed to be in direct contact with the memory elements and the resin package.

3. A semiconductor memory device according to claim 1, wherein the memory elements are bipolar semiconductor memory elements having a memory capacity of at least 1K-bit.

4. A semiconductor memory device according to claim 1, wherein the memory elements are MIS semiconductor memory elements having a memory capacity of at least 16K-bits.

5. A semiconductor memory device according to claim 1, wherein the memory elements are MIS semiconductor memory elements having a memory capacity of at least 64K-bits.

6. A semiconductor memory device according to claim 1, wherein the resinous material contains uranium and thorium in amounts of 0.2 part per billion or less in total.

7. A semiconductor memory device according to claim 1, wherein the resinous material is a synthetic resin, a natural resin, a synthetic rubber or a natural rubber.

8. A semiconductor memory device according to claim 7, wherein the resinous material is a synthetic resin comprised of a polyimide, a polyamide, polybenzimidazole, a polyamideimide, a polyimide-isoindroquinazolinedion, an epoxy resin, a phenolic resin, a diallyl phthalate resin, a fluorine resin, a polyester resin, a silicone resin or polysilicate resin.

9. A semiconductor memory device according to claim 1, 6, 7 or 8, wherein the resinous material contains one or more fillers.

10. A semiconducotr memory device according to claim 1, wherein the resin package is a cured thermosetting resin.

11. In a semiconductor memory device comprising semiconductor memory elements having such a degree of intergration in memory circuits as to produce soft errors by incident α-rays derived from a resin packaging material and a resin package which packages the memory elements, the improvement wherein an α-rays shielding layer made from a resinous material containing uranium and thorium in a total amount of 1 part per billion or less and having a thickness of at least 40 μm is formed on the memory elements, and wherein the resin package is made from the same material as used as the resinous material of said shielding layer.

12. A semiconductor memory device according to claim 11, wherein the resinous material is a thermosetting resin.

13. A semiconductor memory device according to claim 12, wherein the thermosetting resin contains one or more fillers.

14. A semiconductor memory device according to claim 11, wherein the memory elements are bipolar semiconductor memory elements having a memory capacity of at least 1K-bit.

15. A semiconductor memory device according to claim 11, wherein the memory elements are MIS semiconductor memory elements having a memory capacity of at least 16K-bits.

16. A semiconductor memory device according to claim 11, wherein the memory elements are MIS semiconductor memory elements having a memory capacity of at least 64K-bits.

17. In a semiconductor memory device comprising semiconductor memory elements having such a degree of integration in memory circuits as to produce soft errors by incident α-rays derived from a resin packaging material and a resin package which packages the memory elements, the improvement wherein an α-rays shielding layer made from a resinous material containing uranium and thorium in a total amount of 1 part per billion or less and having a thickness of at least 40μm is formed in direct contact with the memory elements and the resin package, and wherein the resin package is made from the same material as used as the resinous material of said shielding layer.

* * * * *